(12) United States Patent
Kim et al.

(10) Patent No.: US 7,652,942 B2
(45) Date of Patent: Jan. 26, 2010

(54) SENSE AMPLIFIER, SEMICONDUCTOR MEMORY DEVICE INCLUDING THE SAME, AND DATA SENSING METHOD

(75) Inventors: Myeong-o Kim, Suwon-si (KR); Yun-sang Lee, Daejeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 69 days.

(21) Appl. No.: 11/757,099

(22) Filed: Jun. 1, 2007

(65) Prior Publication Data

US 2008/0056039 A1 Mar. 6, 2008

(30) Foreign Application Priority Data

Aug. 4, 2006 (KR) .................. 10-2006-0073772

(51) Int. Cl.
*G11C 7/00* (2006.01)

(52) U.S. Cl. ............. 365/205; 365/189.06; 365/189.07; 365/154; 365/210.1

(58) Field of Classification Search ................ 365/200, 365/233.11, 233.14, 233.15, 210, 205, 189.06, 365/189.07, 154, 185.2, 185.21

See application file for complete search history.

(56) References Cited

U.S. PATENT DOCUMENTS 5,414,662 A * 5/1995 Foss et al. .................. 365/203
5,608,668 A 3/1997 Zagar et al.
6,377,504 B1 * 4/2002 Hilbert .................. 365/230.03
6,768,686 B2 * 7/2004 Frey ...................... 365/189.07
6,914,837 B2 * 7/2005 Schroeder et al. ........... 365/205
7,177,216 B2 * 2/2007 Suh et al. .................... 365/205
7,317,646 B2 * 1/2008 Yoon et al. .................. 365/205

FOREIGN PATENT DOCUMENTS

JP 2003-242773 8/2003
KR 100272162 8/2000

* cited by examiner

*Primary Examiner*—J. H. Hur
*Assistant Examiner*—Tha-o Bui
(74) *Attorney, Agent, or Firm*—F. Chau & Associates, LLC (57) ABSTRACT

A sense amplifier includes a reference signal providing unit and an internal sense amplification unit. The reference signal providing unit provides a reference bit line signal in response to a reference control signal. The internal sense amplification unit receives the reference bit line signal and data signals that correspond to the data. The received signals are provided through bit lines connected to the memory cell array. The internal sense amplification unit senses the received reference bit line signal and the data signals and amplifies the sensed signals. The sense amplifier senses data stored in memory cells connected to dummy bit lines of the outmost memory cell array of a semiconductor memory device such that the memory cells that are not used can be used. Accordingly, the design area and cost of the semiconductor memory device can be reduced.

12 Claims, 4 Drawing Sheets

SENSE AMPLIFIER, SEMICONDUCTOR MEMORY DEVICE INCLUDING THE SAME, AND DATA SENSING METHOD

CROSS-REFERENCE TO RELATED PATENT APPLICATION

This application claims priority to Korean Patent Application No. 10-2006-0073772, filed on Aug. 4, 2006, in the Korean Intellectual Property Office, the disclosure of which is hereby incorporated by reference herein in its entirety.

BACKGROUND OF THE INVENTION

1. Technical Field

The present invention relates to a semiconductor memory device, and more particularly, to a sense amplifier, a semiconductor memory device including the sense amplifier, and a data sensing method.

2. Discussion of the Related Art

In a semiconductor memory device including a dynamic random access memory (DRAM), data stored in a memory cell is read by a sense amplifier connected to a bit line. The data stored in the memory cell is transferred to the sense amplifier through the bit line, amplified by the sense amplifier, and then output from the sense amplifier. In this manner, the data stored in the memory cell is read.

Bit lines and sense amplifiers are generally arranged according to a folded bit line structure or an open bit line structure. In the folded bit line structure, two bit lines in a pair are connected to the same memory cell array. In the open bit line structure, the two bit lines in a pair are respectively connected to different memory cell arrays.

Figure 1:
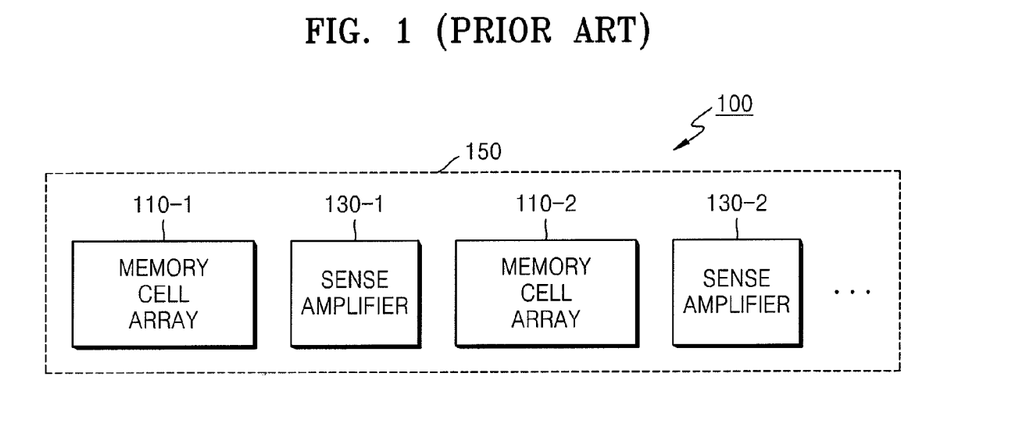
FIG. 1 is a block diagram of a conventional semiconductor memory device including a plurality of memory cell arrays and a plurality of sense amplifiers.
Figure 2:
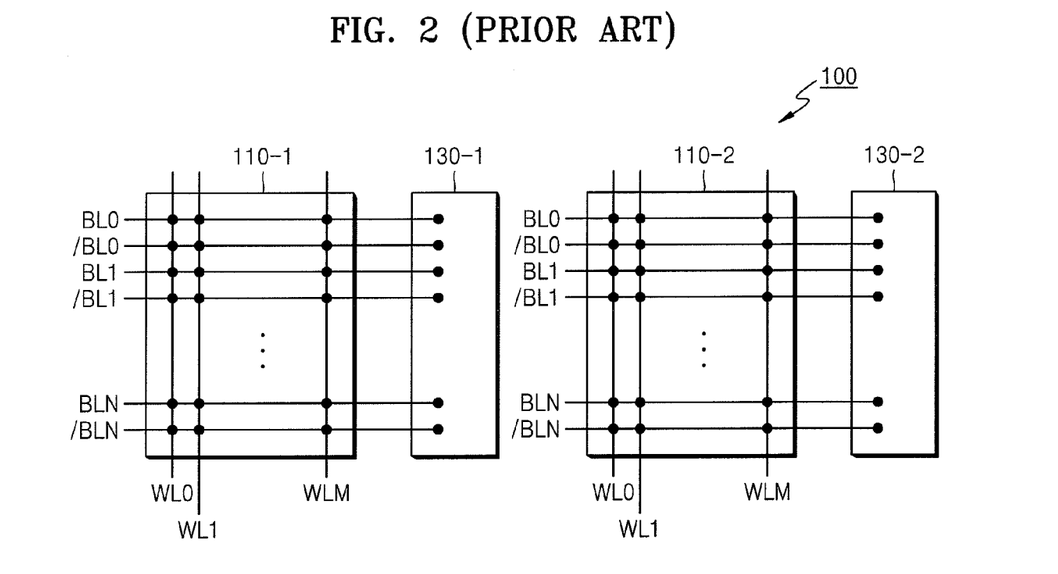
FIG. 2 is a diagram of a folded bit line structure.
Figure 3:
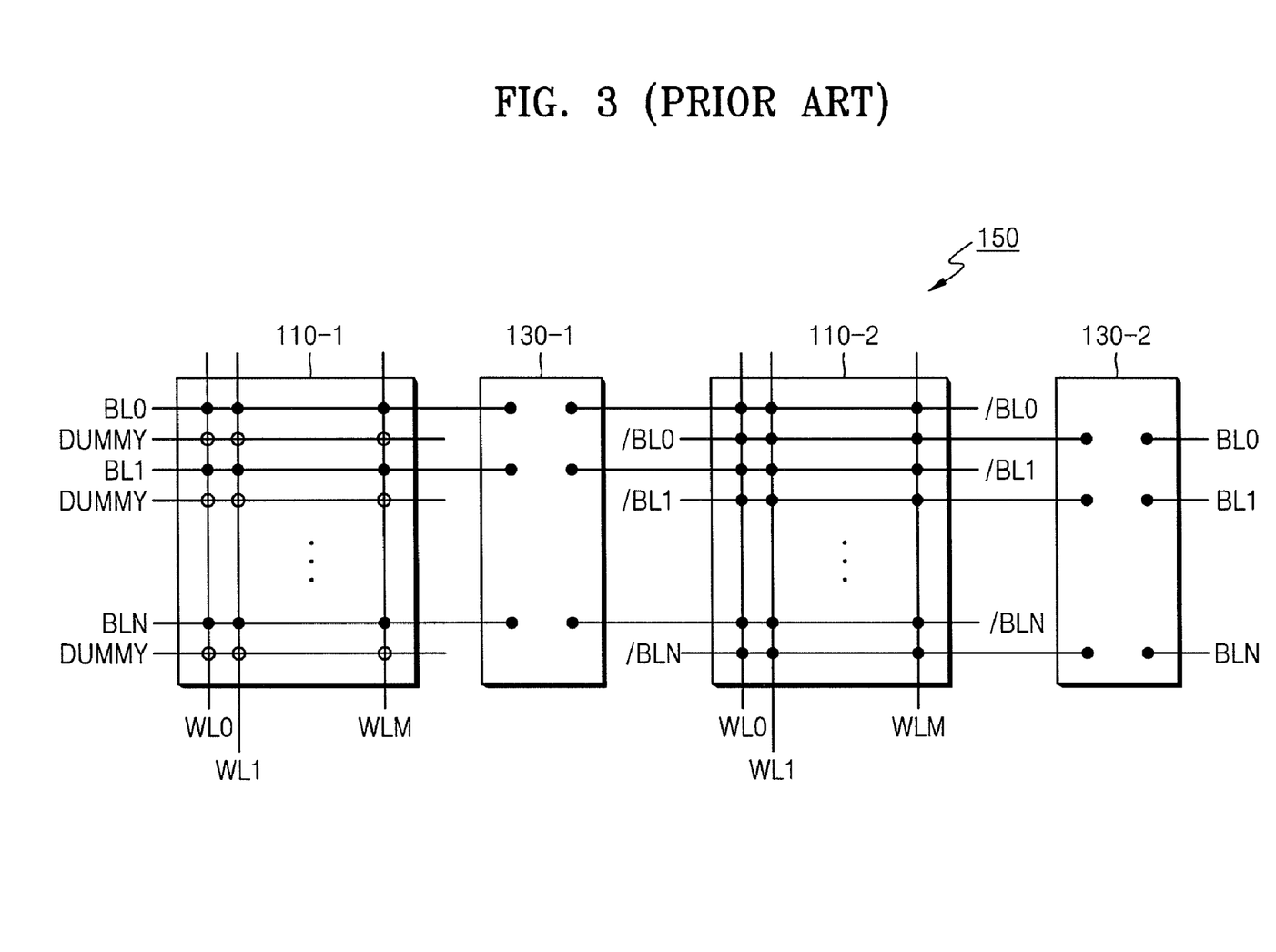
FIG. 3 is a diagram of an open bit line structure.

FIG. 1 is a block diagram of a conventional semiconductor memory device 100 including a plurality of memory cell arrays 110-1, 110-2, . . . and a plurality of sense amplifiers 130-1, 130-2, . . . . FIG. 2 is diagram explaining the folded bit line structure. FIG. 3 is a diagram explaining the open bit line structure.

Referring to FIG. 1, in the semiconductor memory device 100, the plurality of memory cell arrays 110-1, 110-2, . . . and the plurality of sense amplifiers 130-1, 130-2, . . . are arranged in an alternating pattern 150. It will be understood by those of ordinary skill in the art that the memory cell arrays can be either blocks or banks.

Referring to FIG. 2, bit line pairs BL0 and /BL0, BL1 and /BL1, through BLN and /BLN are respectively connected to the memory cell arrays 110-1, 110-2, . . . in the folded bit line structure. Thus, the number of the memory cell arrays is equal to the number of the sense amplifiers in the semiconductor memory device 100.

Referring to FIG. 3, two bit lines in a pair, BL0 and /BL0, BL1 and /BL1, through BLN and /BLN, are respectively connected to neighboring memory cell arrays 110-1 and 110-2, for example, in the open bit line structure. Thus, the number of the memory cell arrays of the semiconductor memory device 100 is greater than the number of the sense amplifiers by one. A semiconductor memory device therefore requires one more memory cell array when it employs the open bit line structure compared to when it employs the folded bit line structure.

With the advancement of semiconductor memory device technology, the chip size of a semiconductor memory device is reduced and a process for designing the semiconductor memory device becomes more delicate. Accordingly, a bit line pitch becomes important in the design of a region where bit lines and sense amplifiers are arranged.

It can be seen from FIGS. 2 and 3 that the open bit line structure has a more desirable bit line pitch than the folded bit line structure. Thus, the open bit line structure is widely used to design a region where bit lines and sense amplifiers are arranged in the current semiconductor memory device.

However, as illustrated in FIG. 3, in the open bit line structure, as many as half the bit lines arranged in the outmost memory cell array are DUMMY bit lines and are not used in the semiconductor memory device 100. Thus, memory cells connected to the DUMMY bit lines become dummy cells that are not used.

In the case of the semiconductor memory device 100 illustrated in FIG. 3, when dummy cells of the rightmost memory cell array and the leftmost memory cell arrays are considered, memory cells corresponding to a single memory cell array are not used. Accordingly, the open bit line structure brings about large loss in the area and increased cost of a semiconductor memory device.

SUMMARY OF THE INVENTION

Exemplary embodiments of the present invention provides a sense amplifier for sensing data stored in the outmost memory cell array in the open bit line structure and a semiconductor memory device including the sense amplifier.

Exemplary embodiments of the present invention provide a method of sensing data stored in the outmost memory cell array in the open bit line structure.

According to an aspect of the present invention, a sense amplifier is provided. The sense amplifier includes a reference signal providing unit and an internal sense amplification unit. The reference signal providing unit provides a reference bit line signal in response to a reference control signal. The internal sense amplification unit receives the reference bit line signal and data signals that correspond to the data and are provided through bit lines connected to the memory cell array, senses the received reference bit line signal and the data signals and amplifies the sensed signals.

The sense amplifier may further include a connection controller controlling the connection of the internal sense amplification unit to the bit lines and the reference signal providing unit in response to an isolation signal.

The isolation signal may disconnect the internal sense amplifier from the bit lines and the reference signal providing unit when the sense amplification unit senses the reference bit line signal and the data signals. The isolation signal may connect the internal sense amplifier to the bit lines and the reference signal providing unit after the sense amplification unit senses the reference bit line signal and the data signals.

The reference signal providing unit, may include a plurality of transistors respectively corresponding to the bit lines. The plurality of transistors respectively have first terminals receiving the reference bit line signal, second terminals connected to the connection controller, and gates receiving a sensing enable signal.

The connection controller may include a first transistor group including a plurality of transistors that respectively correspond to the bit lines and have first terminals connected to the reference signal providing unit. The connection controller may also include second terminals connected to the internal sense amplification unit, gates receiving the isolation signal, and a second transistor group. The second transistor group includes a plurality of transistors that respectively correspond to the bit lines and have first terminals connected to the bit lines, second terminals connected to the internal sense amplification unit, and gates receiving the isolation signal.

The isolation signal may have a tri-state level. The isolation signal may have a predetermined intermediate level before the internal sense amplification unit senses the reference bit line signal and the data signals. The isolation signal may have a low level lower than the intermediate level while the internal sense amplification unit senses and amplifies the reference bit line signal and the data signals. The isolation signal may have a high level higher than the intermediate level after the internal sense amplification unit amplifies the reference bit line signal and the data signals. The intermediate level may correspond to a power voltage, the low level may correspond to a ground voltage, and the high level may correspond to a voltage obtained by boosting the power voltage.

The sense amplifier may he used for an open bit line structure.

According to another aspect of the present invention, a semiconductor memory device is provided. The semiconductor memory device includes a plurality of memory cell arrays, a plurality of sense amplifiers, and at least one outmost sense amplifier. Each of the plurality of sense amplifiers is arranged between neighboring memory cell arrays. The plurality of sense amplifiers sense data signals received through bit line pairs connected to neighboring memory cell arrays and amplify the sensed data signals. The at least one outmost sense amplifier is arranged in close proximity to the outmost memory cell array from among the plurality of memory cell arrays. The outmost sense amplifier senses data signals received through bit lines connected to the outmost memory cell array and a reference bit line signal received in response to a reference control signal and amplifies the sensed signals.

The outmost sense amplifier may include a reference signal providing unit and an internal sense amplification unit. The reference signal providing unit provides the reference bit line signal in response the reference control signal. The internal sense amplification unit may sense the received reference bit line signal and the data signals and amplify the sensed signals.

The outmost sense amplifier may further include a connection controller controlling the connection of the internal sense amplification unit to the bit lines and the reference signal providing unit, in response to an isolation signal.

The isolation signal may disconnect the internal sense amplifier from the outmost memory cell array and the reference signal providing unit, when the sense amplification unit senses the reference bit line signal and the data signals received from the outmost memory cell array. The isolation signal may connect the internal sense amplifier to the outmost memory cell array and the reference signal providing unit after the sense amplification unit senses the reference bit line signal and the data signals received from the outmost memory cell array.

The isolation signal may have a tri-state level. The isolation signal may have a predetermined intermediate level before the internal sense amplification unit senses the reference bit line signal and the data signals. The isolation signal may have a low level lower than the intermediate level while the internal sense amplification unit senses and amplifies the reference bit line signal and the data signals. The isolation signal may have a high level higher than the intermediate level after the internal sense amplification unit amplifies the reference bit line signal and the data signals. The intermediate level may correspond to a power voltage, the low level may correspond to a ground voltage, and the high level may correspond to a voltage obtained by boosting the power voltage.

The semiconductor memory device may use an open bit line structure.

According to another aspect of the present invention, a method of sensing data stored in a memory cell array is provided. The method includes providing a reference bit line signal in response to a reference control signal. The reference bit line signal and a data signal corresponding to the data are received. The data signal is provided through a bit line connected to the memory cell array. The received reference bit line signal and the data signal are sensed and the sensed signals are amplified.

The sensing of the received reference bit line signal and the data signal may include blocking the reference bit line signal and the data signal from being received when the received reference bit line signal and the data signal are sensed. The sensing of the received reference bit line signal and the data signal may further include sensing the received reference bit line signal and the data signal, canceling cut-off of reception of the reference bit line signal and the data signal, amplifying the sensed reference bit line signal and the data signal, and storing the amplified data signal in a corresponding memory cell.

The method may be used for an open bit line structure.

BRIEF DESCRIPTION OF THE DRAWINGS

The above and other features of the exemplary embodiments of the present invention will become more apparent by describing the exemplary embodiments in detail with reference to the attached drawings in which.

DETAILED DESCRIPTION OF THE EXEMPLARY EMBODIMENTS

Exemplary embodiments of the present, invention will now be described more fully with reference to the accompanying drawings. The exemplary embodiments of the invention may, however, be embodied in many different forms and should not be construed as being limited to the exemplary embodiments set forth herein. Throughout the drawings, like reference numerals may refer to like elements.

Exemplary embodiments of the present invention may be explained with respect to a configuration of sensing data stored in memory cells of memory cell arrays. The operation of a semiconductor memory device according to an exemplary embodiment of the present invention will be equal to the operation of a conventional semiconductor memory device except where otherwise noted.

Figure 4:
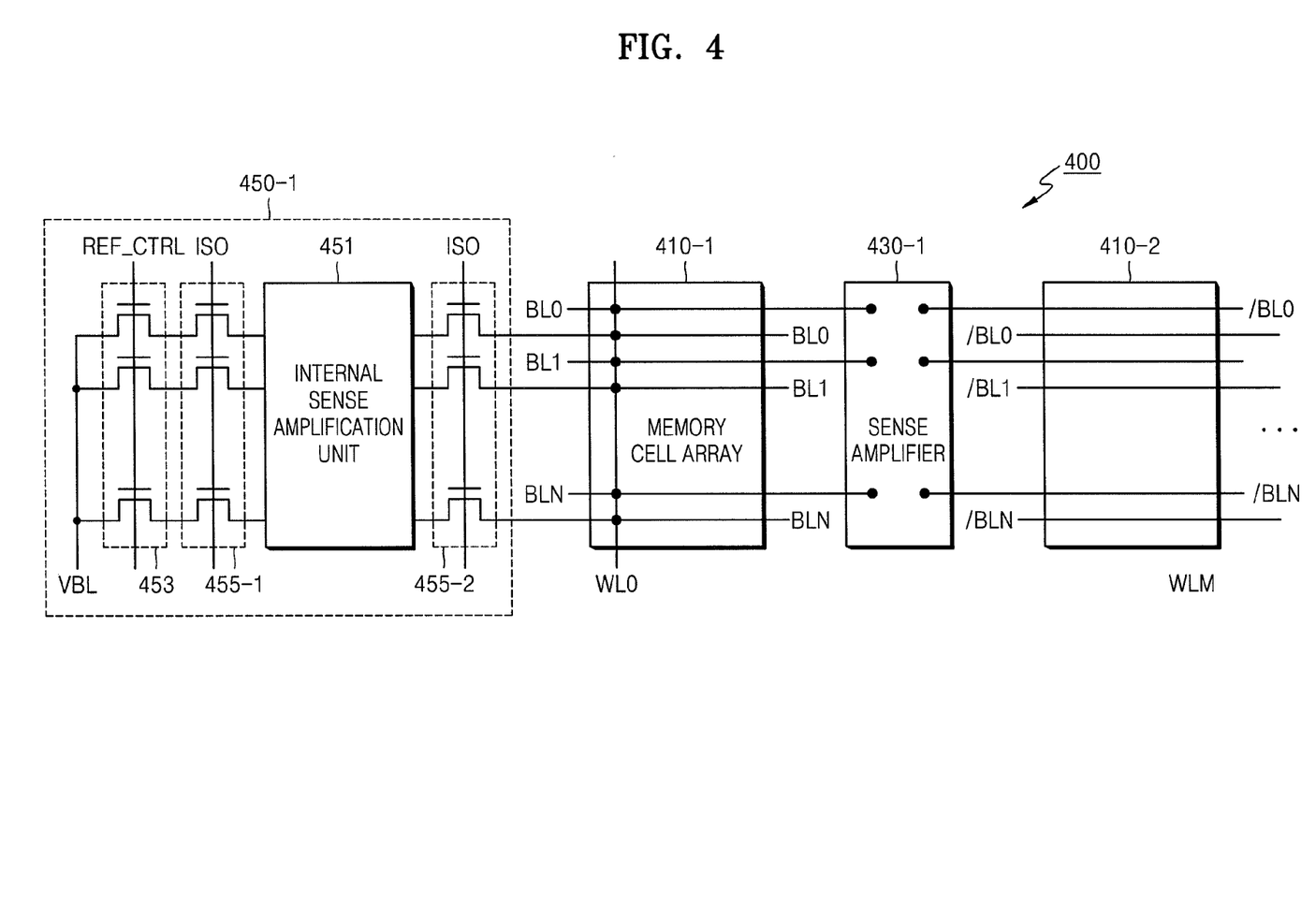
FIG. 4 is a block diagram of a semiconductor memory device according to an exemplary embodiment of the present invention.

FIG. 4 is a block diagram of a semiconductor memory device 400 according to an exemplary embodiment of the present invention. Referring to FIG. 4, the semiconductor memory device 400 includes a plurality of memory cell arrays 410-1, 410-2, . . . a plurality of sense amplifiers 430-1, . . . , and at least one outmost sense amplifier 450-1.

The plurality of memory cell arrays 410-1, 410-2, . . . and the plurality of sense amplifiers 430-1, . . . are alternately arranged. The sense amplifiers 430-1, . . . are connected to bit line pairs BL0 and /BL0, BL1 and /BL1, through BLN and /BLN. Sense data signals received from the bit line pairs BL0 and /BL0, BL1 and /BL1, through BLN and /BLN and amplify the sensed data signals.

The bit line pairs BL0 and /BL0, BL1 and /BL1, through BLN and /BLN are respectively composed of bit lines BL0, BL1, through BLN and inverted bit lines /BL0, /BL1, through /BLN. The bit lines BL0, BL1, through BLN are connected to a memory cell array and the inverted bit lines /BL0, /BL1, through /BLN are connected to a memory cell array adjacent to the memory cell array.

Specifically, the bit lines BL0, BL1, through BLN connected to the sense amplifier 430-1 are connected to the memory cell array 410-1 and the inverted bit lines /BL0, /BL1, through /BLN connected to the sense amplifier 430-1 are connected to the memory cell array 410-2. Similarly, the bit lines BL0, BL1, through BLN connected to the second sense amplifier (not shown) are connected to the third memory cell array (not shown). The inverted bit lines /BL0, /BL1, through /BLN connected to the second sense amplifier (not shown) are connected to the memory cell array 410-2.

In the semiconductor memory device 400 illustrated in FIG. 4, either bit lines or inverted bit lines from among bit line pairs connected to a sense amplifier are connected to a memory cell array adjacent to the sense amplifier. However, it will be understood by those of ordinary skill in the art that bit lines and inverted bit lines can be connected together to a memory cell array.

In the conventional memory device 100 using the open bit line structure, half of the memory cells of the outmost memory cell array 110-1 are dummy cells that are not used, as illustrated in FIGS. 1 and 3.

The semiconductor memory device 400 according to an exemplary embodiment of the present invention includes at least one outmost sense amplifier 450-1 using all the memory cells of the outmost memory cell array 410-1. The outmost sense amplifier 450-1 is arranged in close proximity to the outmost memory cell array 410-1. The outmost sense amplifier 450-1 is connected to the outmost memory cell array 410-1 through the bit lines BL0 through BLN.

While FIG. 4 illustrates the leftmost memory cell array 410-1, it will be understood by those of ordinary skill in the art that exemplary embodiments of the present invention can be applied to other outmost memory cell arrays including the rightmost memory cell array.

The structures and operations of the leftmost memory cell array 410-1 and the outmost sense amplifier 450-1 will be explained. When it is assumed that the memory cell arrays illustrated in FIG. 4 are DRAM cells, the memory cell arrays 410-1, 410-2, . . . include a plurality of memory cells (not shown) each having a cell transistor (not shown) and a cell capacitor (not show) storing data in the form of a charge. A first terminal of the cell transistor is connected to a bit line, a second terminal of the cell transistor is connected to the cell capacitor and the gate of the cell transistor is connected to a word line.

The operation of the sense amplifiers 430-1, . . . for sensing data stored in memory cells will be explained.

After a word line WL0 is enabled, charge-sharing occurs between the bit lines BL0 through BLN and cell capacitors (not shown) and thus data signals corresponding to charges stored in the cell capacitors are applied to the bit lines BL0 through BLN. At this time, a predetermined reference signal that will be compared to the data signals is applied to the inverted bit lines /BL0 through /BLN.

The sense amplifier 430-1 reads data by sensing a difference between the data signals applied to the bit lines BL0 through BLN and the reference signal applied to the inverted bit lines /BL0 through /BLN and amplifying the sensed difference. The amplified data signals are stored in the memory cells.

When the bit lines BL0 through BLN and the inverted bit lines /BL0 through /BLN are mismatched, the data signals can be inverted when the sense amplifier 430-1 senses the data signals and the reference signal. The sense amplifier 430-1 may misrecognize a data signal as the reference signal and misrecognize the reference signal as a data signal. As a result, the sense amplifier 430-1 may incorrectly sense data stored in a memory cell.

To minimize the incorrect sensing of data stored in the memory cell, the bit lines BL0 through BLN and the inverted bit lines /BL through /BLN are constructed in the same manner such that the bit lines BL0 through BLN and the inverted bit lines /BL0 through /BLN are not mismatched. However, when the bit lines BL0 through BLN and the inverted bit lines /BL0 through /BLN are constructed in this manner, half the memory cells of the outmost memory cell array are not used, as described above.

Exemplary embodiments of the present invention minimizes mismatch of bits lines and inverted bit lines when the sense amplifier senses a data signal and the reference signal. Accordingly, dummy cells of the outmost memory cell array can be used. When signals applied to bit lines or inverted bit lines are correctly sensed, data inversion due to the mismatch occurring after the sensing operation can be prevented by the amplification operation of the sense amplifier.

Referring back to FIG. 4, the outmost sense amplifier 450-1 senses data signals applied to the bit lines BL0 through BLN connected to the outmost memory cell array 410-1 and a reference bit line signal VBL provided in response to a reference control signal REF_CTRL and amplifies the sensed signals. The data signals are applied to the bit lines BL0 through BLN according to charge sharing after the word line WL0 is enabled. The reference bit line signal VBL is compared to the data signals applied to the bit lines BL0 through BLN. The reference control signal REF_CTRL may be enabled before a sensing enable signal SA_EN is enabled. The sensing signal SA_EN is enabled after the word line WL0 is enabled and disabled.

The outmost sense amplifier 450-1 includes a reference signal providing unit 453 and an internal sense amplification unit 451. The outmost sense amplifier 450-1 can further include a connection controller. The operation of sensing data stored in the outmost memory cell array 410-1 using the reference signal providing unit 453 and the internal sense amplification unit 451 are explained below.

The reference signal providing unit. 453 provides the reference bit line signal VBL in response to the reference control signal REF_CTRL. Since the reference bit line signal VBL is compared to data signals received through the bit lines BL0 through BLN, the reference signal providing unit 453 can be considered to function as inverted bit lines /BL0 through /BLN.

The reference signal providing unit 453 includes a plurality of transistors respectively corresponding to the bit lines BL0 through BLN connected to the outmost memory cell array 410-1. First terminals of the plurality of transistors receive the reference bit line signal VBL and gates of the plurality of transistors receive the reference control signal REF_CTRL. The reference bit line signal VBL is output to second terminals of the plurality of transistors in response to the reference control signal REF_CTRL. The reference bit line signal VBL is provided as a signal that is compared to data signals.

The internal sense amplification unit 451 senses the reference bit line signal VBL and the data signals received through the bit lines BL0 through BLN and amplifies the sensed signals. The structure and operation of the internal sense amplification unit 451 are identical to those of the sense amplifiers 410-1, 410-2, . . . .

When the reference bit line signal VBL is provided using the reference signal providing unit 453, a mismatch may occur between the bit lines BL0 through BLN connected to the internal sense amplification unit 451 and the reference signal providing unit 453. Exemplary embodiments of the present invention use the connection controller to reduce mismatch.

The connection controller controls the connection of the internal sense amplification unit 451 to the reference signal providing unit 453 and the outmost memory cell array 410-1 in response to an isolation signal ISO. The isolation signal ISO disconnects the internal sense amplification unit 451 from the reference signal providing unit 453 and the outmost memory cell array 410-1 when the internal sense amplification unit 451 senses the reference bit line signal VBL and data signals. The isolation signal ISO connects the internal sense amplification unit 451 to the reference signal providing unit 453 and the outmost memory cell array 410-1 after the internal sense amplification unit 451 senses the reference bit line signal VBL and the data signals.

The connection controller includes a first transistor group 455-1 and a second transistor group 455-2. The transistors of the first groups 455-1 and the transistors of the second group 455-2 correspond to the respective bit lines connected to the outmost memory cell array 410-1. First terminals of the transistors of the first group 455-1 are connected to the reference signal providing unit 453 and second terminals thereof are connected to the internal sense amplification unit 451. The gates of the transistors of the first group 455-1 receive the isolation signal ISO. As illustrated in FIG. 4, the first terminals of the transistors of the first group 455-1 are respectively connected to second terminals of the transistors of the reference signal providing unit 453.

First terminals of the transistors of the second group 455-2 are respectively connected to the bit lines BL0 through BLN connected to the outmost memory cell array 410-1 and second terminals thereof are connected to the internal sense amplification unit 451. The gates of the transistors of the second group 455-2 receive the isolation signal ISO.

While the connection controller includes two transistor groups 455-1 and 455-2 in the present exemplary embodiment, one of the two transistor groups 455-1 and 455-2 controls the connection of the internal sense amplification unit 451 to the reference signal providing unit 453 and the outmost memory cell array 410-1. However, the two transistor groups may be respectively arranged on both sides of the internal sense amplification unit 451 such that coupling caused by capacitance of the drains or sources of transistors becomes uniform. Accordingly, mismatch may be further reduced As described above, the operation of the connection controller using the isolation signal ISO improves the mismatch when the internal sense amplification 451 senses the reference bit line signal and data signals. Consequently, all the cells of the outmost memory cell array can be used.

Figure 5:
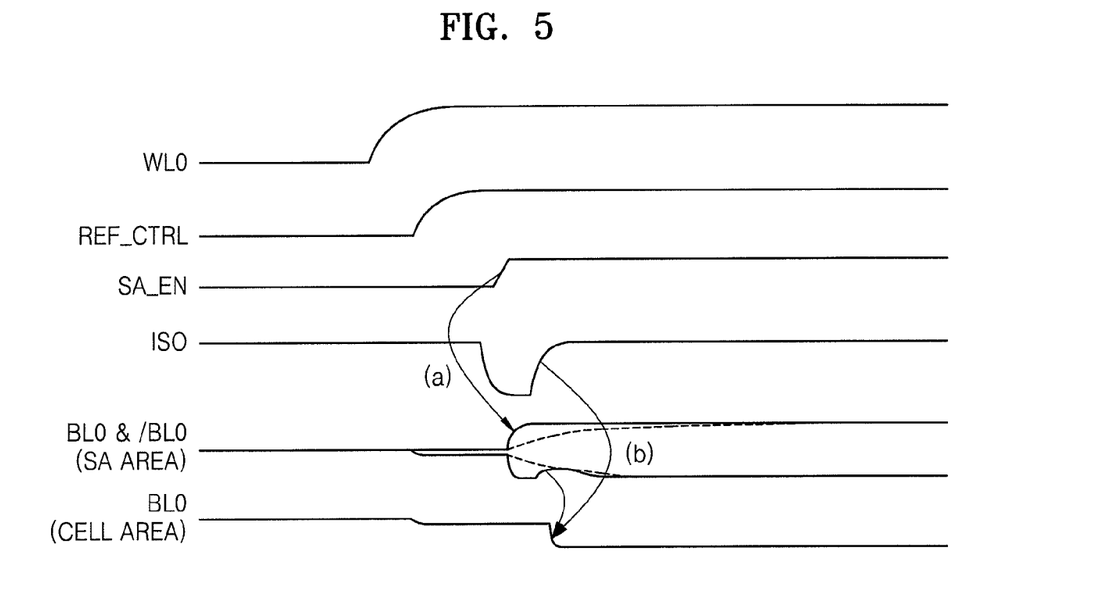
FIG. 5 is a timing diagram showing the operation of the semiconductor memory device illustrated in FIG. 4 according to an exemplary embodiment of the present invention.

FIG. 5 is a timing diagram showing the operation of the semiconductor memory device illustrated in FIG. 4 according to an exemplary embodiment of the present invention. The operation of the semiconductor memory device according to an exemplary embodiment of the present invention is explained below with reference to FIG. 5.

In FIG. 5, WL0 denotes a signal applied to the word line WL0, REF_CTRL denotes the reference control signal, SA_EN represents the sensing enable signal, and ISO represents the isolation signal. In the present exemplary embodiment, the level of the enabled isolation signal ISO is substantially identical to the level of the signal applied to the word line WL0. Furthermore, the isolation signal ISO may have a tri-state level. An exemplary embodiment of the present invention in which the isolation signal ISO has a tri-state level is explained below with reference to FIG. 6.

In addition, BL0 & /BL0 (SA AREA) denotes a signal applied to bit lines located in the area of the internal sense amplification unit 451. These bit lines are connected to the internal sense amplification unit 451 and the first transistor group 455-1 of the connection controller. BL0 & /BL0 (CELL AREA) denotes a signal applied to bit lines located in the area of the outmost memory cell array 410-1. These bit lines are connected to the outmost memory cell array 410-1 and the second transistor group 455-2 of the connection controller. For this exemplary embodiment, it is assumed that data having a logic low level is stored in a memory cell connected to the bit line BL0.

Signals applied to the bit line BL0 and the inverted bit line /BL0 connected to the internal sense amplification 451 and the bit line BL0 connected to the outmost memory cell array 410-1 all maintain a predetermined voltage before the word line WL0 is enabled, the predetermined voltage may correspond to the voltage of the reference bit line signal.

When the word line WL0 is enabled, the voltages of the signals applied to the bit line BL0 connected to the internal sense amplification unit 451 and the bit line BL0 connected to the outmost memory cell array 410-1 are slightly reduced due to charge sharing of the bit lines BL0 through BLN and cell capacitors of memory cells.

After the word line WL0 is enabled, the reference control signal REF_CTRL is also enabled and the reference signal providing unit 453 provides the reference bit line signal VBL to the inverted bit line /BL0 in response to the enabled reference control signal REF_CTRL. Accordingly, the inverted bit line /BL0 connected to the internal sense amplification unit 451 continuously maintains the predetermined voltage.

The signals applied to the bit line BL0 and the inverted bit line /BL0 continuously maintain their voltages before the sensing enable signal SA_EN is enabled. The sensing enable signal SA_EN is enabled after the word line WL0 and the reference control signal REF_CTRL are enabled. The internal sense amplification unit 451 receives the reference bit line signal VBL and the data signal applied to the bit line BL0.

When the sensing enable signal SA_EN is enabled, the internal sense amplification unit 451 senses the received reference bit line signal VBL and the data signal and amplifies the received signals. At this time, the isolation signal ISO is disabled before the sensing enable signal SA_EN is enabled, and thus the connection controller disconnects the Internal sense amplification unit 451 from the outmost memory cell array 410-1 and the reference signal providing unit 453. The bit line BL0 and the inverted bit line /BL0 are separated from the internal sense amplification unit 451.

The isolation signal ISO is disabled before the sensing enable signal SA_EN is enabled and the internal sense amplification unit 451 does not receive the reference bit line signal VBL and the data signal. Accordingly, the mismatch between the bit line BL0 and the inverted bit line /BL0 does not affect the sensing operation of the internal sense amplification unit 451.

Referring to FIG. 5, the data signal applied to the bit line BL0 and the inverted bit line /BL0 located in the area of the internal sense amplification unit and the reference bit line signal VBL are sensed (refer to arrow (a)) in response to the enable sensing enable signal SA_EN. At this time, the signal BL0 (CELL AREA) of the bit line BL0 located in the area of the outmost memory cell array maintains its voltage while the isolation ISO is still disabled.

The isolation signal ISO is enabled again while the internal sense amplification unit 451 senses and amplifies the data signal and the reference bit line signal VBL. The connection controller 455-1 and 455-2 connects the internal sense amplification unit 451 to the reference signal providing unit 453 and the outmost memory cell array 410-1 in response to the enabled isolation signal ISO.

Since the outmost memory cell array 410-1 is connected to the internal sense amplification unit 451, the data signal amplified by the internal sense amplification unit 451 is applied to the bit line BL0 (refer to arrow (b) illustrated in FIG. 5) and data corresponding to the amplified data signal applied to the bit line BL0 is stored in a memory cell.

The internal sense amplification unit 451 is isolated from other areas while the internal sense amplification unit 451 senses and amplifies the reference bit line signal VBL and the data signal. Accordingly, the internal sense amplification unit 451 can directly perform the sensing and amplification operations in response to the sensing enable signal SA_EN irrespective of the mismatch of the bit line BL0 and the inverted bit line /BL0, as illustrated as BL0 & /BL0 (SA AREA) in FIG. 5 (refer to bolded lines).

Dotted lines illustrated in FIG. 5 represent general sensing and amplification operations. When the sense amplification unit 451 is not isolated, the sensing and amplification operations are slowly performed, and thus data inversion may occur due to the mismatch of a bit line and an inverted bit line. According to exemplary embodiments of the present invention, the sensing and amplification operations can be carried out rapidly and correctly without being affected by the mismatch of a bit line and an inverted bit line.

Figure 6:
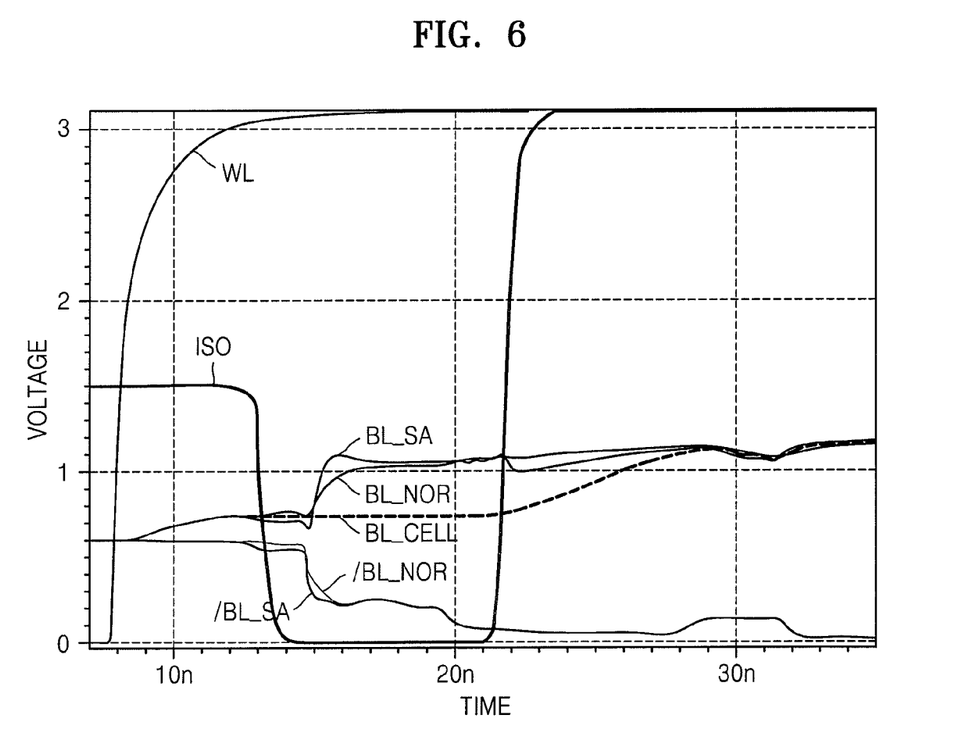
FIG. 6 is a timing diagram showing the operation of the semiconductor memory device according to an exemplary embodiment of the present invention.

FIG. 6 is a timing diagram for explaining the operation of the semiconductor memory device according to an exemplary embodiment of the present invention. In FIG. 6, WL represents a signal applied to a word line driver. BL_SA and /BL_SA denote signals respectively applied to a bit line and an inverted bit line located in the area of the internal sense amplification unit 451. BL_CELL represents a signal applied to a bit line located in the area of the outmost memory cell array 410-1. For this exemplary embodiment, it is assumed that data having a logic high level is stored in a memory cell.

In the embodiment, illustrated in FIG. 6, the isolation signal ISO has a tri-state level. The isolation signal ISO has an intermediate level in the initial period, a low level in a sensing and amplifying period and a high level after amplification.

The low level and the high level of the isolation signal ISO may correspond to the low and high levels of the signal WL applied to the word line driver. Furthermore, a ground level may be used as the low level, a voltage VPP obtained by boosting a power voltage VCC may be used as the high level, and the power voltage VCC may be used as the intermediate level.

As illustrated in FIG. 6, a voltage lower than the voltage of the signal applied to the enabled word line is used as the initial voltage of the isolation signal ISO and the operating speed of the connection controller operating in response to the isolation signal ISO is increased. Thus, the isolation signal ISO may have a tri-state level.

While the semiconductor memory device employing the open bit line structure has been described in the aforementioned exemplary embodiments, it will be understood by those of ordinary skill in the art that exemplary embodiments of the present invention can be applied irrespective of the bit line structure. Furthermore, it will be understood by those of ordinary skill in the art that the outmost sense amplifier can be used as an independent sense amplifier.

For example, in the case where the semiconductor memory device as illustrated in FIG. 1 uses the open bit line structure, if the sense amplifier according to an exemplary embodiment of the present invention is used for the rightmost and leftmost memory cell arrays, the number of memory cell arrays is reduced by one compared to the semiconductor memory device employing the folded bit line structure.

Moreover, when the sense amplifier according to an exemplary embodiment of the present invention is used for both sides of a single memory cell array, the single memory cell array can be used as if it was two memory cell arrays.

As described above, the sense amplifier according to exemplary embodiments of the present invention senses data stored in memory cells connected to dummy bit lines of the outmost memory cell array of a semiconductor memory device. The memory cells that would not otherwise be used can therefore be used. Accordingly, the design area and cost of the semiconductor memory device can be reduced.

While exemplary embodiments of the present invention have been particularly shown and described, it will be understood by those of ordinary skill in the art that various changes in form and details may be made therein without departing from the spirit and scope of the present invention.

What is claimed is:

1. A sense amplifier sensing data stored in memory cells of an outmost memory cell array from among a plurality of memory cell arrays, comprising:

a reference signal providing unit providing a reference bit line signal in response to a reference control signal;

an internal sense amplification unit, connected to the outmost memory cell array, receiving the reference bit line signal and data signals, sensing the received reference bit line signal and the data signals and amplifying the sensed signals, wherein the data signals correspond to the data stored in the memory and are received though bit lines connected to the outmost memory cell array; and a connection controller controlling a connection of the internal sense amplification unit to the bit lines and the reference signal providing unit in response to an isolation signal, wherein the connection controller comprises:

a first transistor group including a first plurality of transistors that respectively correspond to the bit lines and have first terminals connected to the reference signal providing unit, second terminals connected to the internal sense amplification unit, and gates receiving the isolation signal; and a second transistor group including a second plurality of transistors that respectively correspond to the bit lines and have first terminals connected to the bit lines, second terminals connected to the internal sense amplification unit, and gates receiving the isolation signal.

2. A sense amplifier sensing data stored in memory cells of an outmost memory cell array from among a plurality of memory cell arrays, comprising:

a reference signal providing unit providing a reference bit line signal in response to a reference control signal;

an internal sense amplification unit, connected to the outmost memory cell array, receiving the reference bit line signal and data signals, sensing the received reference bit line signal and the data signals and amplifying the sensed signals, wherein the data signals correspond to the data stored in the memory and are received though bit lines connected to the outmost memory cell array; and a connection controller controlling a connection of the internal sense amplification unit to the bit lines and the reference signal providing unit in response to an isolation signal, wherein the isolation signal has a tri-state level.

3. A sense amplifier sensing data stored in memory cells of an outmost memory cell array from among a plurality of memory cell arrays, comprising:

a reference signal providing unit providing a reference bit line signal in response to a reference control signal;

an internal sense amplification unit, connected to the outmost memory cell array, receiving the reference bit line signal and data signals, sensing the received reference bit line signal and the data signals and amplifying the sensed signals, wherein the data signals correspond to the data stored in the memory and are received though bit lines connected to the outmost memory cell array; and a connection controller controlling a connection of the internal sense amplification unit to the bit lines and the reference signal providing unit in response to an isolation signal, wherein the isolation signal has a predetermined intermediate level before the internal sense amplification unit senses the reference bit line signal and the data signals, has a low level lower than the intermediate level while the internal sense amplification unit senses and amplifies the reference bit line signal and the data signals, and has a high level higher than the intermediate level after the internal sense amplification unit amplifies the reference bit line signal and the data signals.

4. The sense amplifier of claim 3, wherein the intermediate level corresponds to a power voltage, the low level corresponds to a ground voltage, and the high level corresponds to a voltage obtained by boosting the power voltage.

5. A method of sensing data stored in an outmost memory cell array from among a plurality of memory cell arrays, comprising:

providing a reference bit line signal in response to a reference control signal;

receiving the reference bit line signal and a data signal corresponding to the data, the data signal being provided through a bit line connected to the outmost memory cell array; and sensing the received reference bit line signal and the data signal and amplifying the sensed signals, wherein the sensing of the received reference bit line signal and the data signal comprises blocking the reference bit line signal and the data signal from being received when the received reference bit line signal and the data signal are sensed, and wherein the sensing of the received reference bit line signal and the data signal further comprises sensing the received reference bit line signal and the data signal, canceling cut-off of reception of the reference bit line signal and the data signal, amplifying the sensed reference bit line signal and the data signal, and storing the amplified data signal in a corresponding memory cell.

6. A semiconductor memory device comprising: a plurality of memory cell arrays; a plurality of sense amplifiers each of which is arranged between neighboring memory cell arrays, the plurality of sense amplifiers sensing data signals received through bit line pairs connected to the neighboring memory cell arrays and amplifying the sensed data signals; and at least one outmost sense amplifier proximal to an outmost memory cell array, from among the plurality of memory cell arrays, the at least one outmost sense amplifier sensing data signals received through bit lines connected to the outmost memory cell array and a reference bit line signal received in response to a reference control signal and amplifying the sensed signals;

wherein the outmost sense amplifier comprises: a reference signal providing unit providing the reference bit line signal in response the reference control signal; and an internal Sense amplification unit sensing the reference bit line signal and the data signals received through the bit lines connected to the outmost memory cell array and amplifying the sensed signals;

wherein the outmost sense amplifier further comprises a connection controller controlling the connection of the internal sense amplification unit to the outmost memory cell array and the reference signal providing unit in response to an isolation signal.

7. The semiconductor memory device of claim 6, wherein the isolation signal disconnects the internal sense amplification unit from the outmost memory cell array and the reference signal providing unit when the sense amplification unit senses the reference bit line signal and the data signals received from the outmost memory cell array.

8. The semiconductor memory device of claim 6, wherein the isolation signal connects the internal sense amplification unit to the outmost memory cell array and the reference signal providing unit after the sense amplification unit senses the reference bit line signal and the data signals received from the outmost memory cell array.

9. The semiconductor memory device of claim 6, wherein the isolation signal has a tri-state level.

10. The semiconductor memory device of claim 9, wherein the isolation signal has a predetermined intermediate level before the internal sense amplification unit senses the reference bit line signal and the data signals, has a low level lower than the intermediate level while the internal sense amplification unit senses and amplifies the reference bit line signal and the data signals, and has a high level higher than the intermediate level after the internal sense amplification unit amplifies the reference bit line signal and the data signals.

11. The semiconductor memory device of claim 10, wherein the intermediate level corresponds to a power voltage, the low level corresponds to a ground voltage, and the high level corresponds to a voltage obtained by boosting the power voltage.

12. The semiconductor memory device of claim 6, wherein the semiconductor memory device uses an open bit line structure.

* * * * *